(12) United States Patent
Grno

(10) Patent No.: US 7,847,543 B2
(45) Date of Patent: Dec. 7, 2010

(54) PRECISION FLEXIBLE CURRENT SENSOR

(76) Inventor: Ladislav Grno, Dlhe diely 11/8, 840 04 Bratislava (SK)

( * ) Notice: Subject to any disclaimer, the term of this patent is extended or adjusted under 35 U.S.C. 154(b) by 0 days.

(21) Appl. No.: 12/154,921

(22) Filed: May 28, 2008

(65) Prior Publication Data

US 2008/0303511 A1 Dec. 11, 2008

Related U.S. Application Data

(63) Continuation-in-part of application No. PCT/SK2005/000023, filed on Nov. 28, 2005.

(51) Int. Cl.
*G01R 33/04* (2006.01)
(52) U.S. Cl. ....................................... 324/253
(58) Field of Classification Search ............ 324/117 H, 324/126–127, 250–253; 336/173–177, 180, 336/182, 188, 220–221, 229
See application file for complete search history.

(56) References Cited

U.S. PATENT DOCUMENTS

| | | | |
|---|---|---|---|
| 3,924,223 A * | 12/1975 | Whyte et al. ................... 307/1 | |
| 4,689,546 A | 8/1987 | Stephens | |
| 4,700,131 A * | 10/1987 | Miller .................... 324/117 H | |
| 5,012,218 A | 4/1991 | Haug | |
| 5,442,280 A | 8/1995 | Baudart | |
| 6,313,623 B1 * | 11/2001 | Kojovic et al. .............. 324/127 | |
| 6,414,475 B1 * | 7/2002 | Dames et al. ................ 324/127 | |
| 6,417,661 B1 * | 7/2002 | Berkcan et al. .......... 324/117 R | |
| 6,566,854 B1 * | 5/2003 | Hagmann et al. ....... 324/117 R | |
| 6,614,218 B1 | 9/2003 | Ray | |
| 6,825,650 B1 | 11/2004 | McCormack | |
| 6,963,195 B1 | 11/2005 | Berkcan | |
| 7,545,138 B2 * | 6/2009 | Wilkerson et al. ........... 324/127 | |
| 2003/0090356 A1 | 5/2003 | Saito | |
| 2003/0137388 A1 | 7/2003 | Meier et al. | |
| 2005/0248430 A1 | 11/2005 | Dupraz et al. | |

FOREIGN PATENT DOCUMENTS

| | | |
|---|---|---|
| DE | 2432919 A1 | 2/1976 |
| DE | 19811366 A1 | 9/1999 |
| DE | 19959789 A1 | 6/2001 |
| DE | 10161370 A1 | 8/2002 |
| EP | 0573350 B1 | 6/1993 |
| EP | 0652441 A1 | 11/1994 |

(Continued)

OTHER PUBLICATIONS

Torres, H, et al., Design Construction and Calibration of Three Devices to Measure Directly Lightning Parameters, High Voltage Engineering, IEE, 11th Symposium, London, UK, Aug. 23-27, 1999, pp. 1-4.

*Primary Examiner*—Ha Tran T Nguyen
*Assistant Examiner*—Joshua Benitez
(74) *Attorney, Agent, or Firm*—Simpson & Simpson, PLLC

(57) ABSTRACT

A flexible current sensor including a sensing cable with a sensing coil wound on a cylindrical flexible core and electrical shielding located over said sensing coil and an outer isolation coat. The electrical shielding includes a plurality of individually isolated shielding wires arranged into groups wound in mutually opposite directions and/or the sensing coil includes a plurality of individually isolated sensing wires arranged into groups wound in mutually opposite directions.

13 Claims, 7 Drawing Sheets

FOREIGN PATENT DOCUMENTS

| | | |
|---|---|---|
| EP | 0834745 A2 | 9/1997 |
| GB | 2259150 A | 3/1993 |
| GB | 2332784 A | 6/1999 |
| GB | 2342783 A | 4/2000 |
| JP | 02118460 | 5/1990 |
| JP | 200065866 | 3/2000 |
| WO | WO96/28737 | 9/1996 |

* cited by examiner

PRECISION FLEXIBLE CURRENT SENSOR

CROSS-REFERENCE TO RELATED APPLICATIONS

This application is filed under 35 U.S.C. §120 and §365(c) as a continuation-in-part of PCT International Application No. PCT/SK2005/000023 filed on Nov. 28, 2005, which application was published in English and which application is incorporated herein by reference.

FIELD OF THE INVENTION

The invention is related to sensor circuit for electrical alternating current. More particularly, the invention is directed to improvement of mechanical construction, electrical configuration, electronic evaluation circuit and use of flexible current sensor.

BACKGROUND OF THE INVENTION

Flexible current sensors are based on flexible inductive coil which can be formed to create a closed path around the measured current carrying conductor. The voltage induced into the coil is proportional to the derivation of the total current flowing through the enclosed area. This principle of current measurement is well known as the Rogowski principle or the Rogowski coil following the publication by Rogowski W. and Steinhaus W. in 1912. A flexible current sensor generally has a form of sensing cable equipped with a mechanical coupling system for either fixing or releasing the sensor cable ends to and from mutually a closed position. The sensing cable consists of sensing coil wound on cylindrical flexible core, optional electrical shielding located over said sensing coil and outer isolation coat. In order to convert the coil voltage to output signal proportional to current an electronic integrator circuit is usually part of the flexible current sensor. The flexible sensors are advantageous for measurement of current in large size wires, difficult shape conductors and conductor groups.

Known constructions of the flexible current sensors have lower amplitude and phase accuracy compared to ferromagnetic current transformer types. The accuracy of flexible current sensors is affected mainly by sensor coil inhomogenity and by residual signals captured via capacitive and inductive coupling to other voltage and current sources. Due to low level of the output voltage of the sensor coil they are sensitive to disturbance, interference and noise generated in evaluation electronics. Commercially available flexible current sensors on Rogowski principle are due to insufficient accuracy dedicated mainly for informative measurements.

An attempt to arrange the classic ferromagnetic current transformer based on soft magnetic material core into flexible probe is disclosed in international publication WO96/28737 (Upton) comprising a helical winding along flexible support comprising an elongate strip of soft magnetic material such as a matrix medium in which particles of low magnetic impedance material are embedded. Disadvantage of this approach is the nonlinearity inherent to any soft magnetic material. This nonlinearity substantially affects the accuracy of the current transformer. Another disadvantage of the disclaimed composite soft magnetic material core are inherent non-magnetic gaps between magnetic particles lowering the effective permeability and thus leading to low winding inductances and mutual coupling resulting to significant phase and amplitude errors.

Relevant solutions for Rogowski coil arrangements and respective electronics can be found in following references:

U.S. Pat. No. 4,689,546 (Stephens et al) discloses arrangement of plurality of classic single-coil flexible Rogowski sensors with conventional metallic shield (FIG. 10). The individual sensors are differentially arranged using differential amplifier to sense error current of the power generator. This arrangement in form of air-core current transformers disposed over conductors of three-phase generator serves as current monitoring equipment for generator control system.

United Kingdom Patent No. GB2259150A discloses arrangements of electronic integrator with combined feedback.

U.S. Pat. No. 5,442,280 discloses fixed Rogowski coil arrangements on printed circuit layout.

European Patent No. EP652441A1 discloses fixed Rogowski coil arrangements for installation with earthed metal casing.

U.S. Pat. No. 6,614,218B1 discloses arrangements of combined passive and active integrator for Rogowski coil. The presented combined integrator shows higher frequency band compare to classic simple integrator but at the expense of lower overall accuracy.

European Patent No. EP0834745A2 discloses arrangement of fixed Rogowski coil with high homogeneity.

Japanese Patent No. JP2000065866 discloses multiple Rogowski coil arrangement for measurement of current flowing through large structure.

United Kingdom Patent Application No. GB2332784A discloses flexible Rogowski coil arrangements consisting of sensor coil wrapped on fixed support structure.

German Patent Application No. DE19811366A1 discloses flexible Rogowski coil arrangements optimized for repeated assembling on power line.

United Kingdom Patent No. GB2342783A discloses fixed Rogowski coil arrangements on printed circuit layout.

German Patent Application No. DE19959789A1 discloses arrangements of electronic integrator with switched DC feedback.

U.S. Pat. No. 6,825,650B1 discloses arrangements of series of fixed Rogowski coils for current measurement in electricity meter.

U.S. Pat. No. 6,313,623B1 discloses spatial arrangements of two Rogowski coils eliminating residual signals.

United States Patent Application Publication No. US2003/0090356A1 discloses fixed Rogowski coil arrangements on printed circuit layout with optic transmission path.

U.S. Pat. No. 6,963,195B1 (Berkcan) discloses fixed Rogowski coil arrangement equipped with additional electrostatic shielding coil. Disadvantage of using single coil as electrostatic shielding is its high impedance resulting to weak shielding effect for strange AC field.

Patent abstract of Japan Publication No. 02118460 (Energy Support Corp) discloses various arrangements of known classic Rogowski coil optimized for measurement of partial current which penetrates a cylinder body.

U.S. Pat. No. 5,012,218 discloses an arrangement of fixed solenoid using Rogowski coil principle for measurement of DC current. The device is equipped with gap for easy positioning of the current carrying conductor into and outside the sensing area of the coil. The influence of the gap is minimized by compensation coils located at the gap ends.

German Patent No. DE2432919A1 (Siemens AG) discloses continuous method of winding of multiple coils for current transducer consisting fixed rigid coils arranged around current caring conductors.

The basic principle of making fixed coil from metal tracks creating pair of go and return winding on the PCB is disclosed in EP0573350 (Dupraz et al).

United States Patent Application Publication No. 2005/248430A1 (Dupraz et al) discloses similar arrangement of fixed Rogowski sensor coil manufactured via PCB technique assembled from partial individually manufactured segments. Similar approach is disclosed in German Patent No. DE10161370 or United States Patent Application Publication No. US2003/137388A1 where the fixed Rogowski coil is constituted by semi-annular portions fabricated via printed circuit technique. The portions are arranged in stack and electrically interconnected to approach the homogeneous coil.

Rogowski coil is can be advantageously used for extremely high amplitude and rise rate current measurement like lightning. Arrangement of fixed Rogowski coil for this purpose is described by Torre et al "Design, construction and calibration of three devices to measure directly lightning parameters". The self-integrating Rogowski coils is built with resistive wire wound on acrylic core. This arrangement acts for high frequencies as integrating device not needing additional integrator.

The extreme linearity, lack of saturation of the non magnetic core and practically non limited frequency range are inherent property of the Rogowski principle based current sensors. These properties still invoke demand for their improvement and application oriented optimization.

Therefore, it is an object for this invention to provide new and improved arrangement of universal generally applicable flexible current sensor and its evaluation electronics yielding higher accuracy comparable to fixed coil arrangements and improvements in its applications.

BRIEF SUMMARY OF THE INVENTION

Electrical shielding of a sensing cable includes a plurality of individually isolated shielding wires. In one embodiment, the shielding wires are arranged into groups wound in mutually opposite directions. In another embodiment, all shielding wires are electrically interconnected in parallel. In a further embodiment, each shielding wire has only one connection point. In yet another embodiment, symmetrical arrangement of shielding consisting of plurality of wires yields high flexibility of sensing cable and minimizes the shielding effective impedance and thus increases the shielding performance. The single connection point of each shielding wire eliminates any flow of induced currents which would affect accuracy.

A sensing coil includes a plurality of individually isolated sensing wires. In one embodiment, the sensing wires are arranged into groups wound in mutually opposite directions. In another embodiment, the sensing wires, respective to voltages induced in sensing wires by magnetic field of sensed current, are electrically interconnected in series or in parallel or in combination of series and parallel or some sensing wires are idle. The interconnection configuration of sensing wires is used to determine the sensing coil sensitivity, impedance and frequency range. In a further embodiment, symmetrical arrangement of sensing wires eliminates influence of outside current sources.

In one embodiment, the shielding wires wound in opposite direction can be advantageously mutually twisted. The shielding wire twisting improves the mechanical stability of the winding and increases effective coverage. The shielding wire twisting also improves the electrical symmetry of wire groups thus lowering shielding impedance yielding further increasing of shielding performance.

In one embodiment, the sensing wires wound in opposite direction can be advantageously mutually twisted. The sensing wire twisting improves the mechanical stability of the winding and thus increases the electrical stability as well. Essential effect of sensing wire twisting is the improvement of symmetry of sensing coil in reference to shielding. The symmetry enables elimination of all common mode residual signals induced by unwanted couplings of the sensing coil to strange sources In another embodiment, the flexible current sensor cable can be advantageously manufactured as continuous cable product on coaxial cable making machine with shielding wires and sensing wires arranged according to the invention. The final sensor is then assembled from portion of desired length cut from already manufactured continuous cable. Continuous cable production assures high homogeneity of windings along the cable length thus increasing the sensor's accuracy and manufacturing repeatability. Further advantage is the lower manufacturing cost compared to individual sensor production.

The symmetrical sensing coil of flexible current sensor according to invention is electrically balanced relative to shielding. Therefore essential elimination of all common mode residual signals induced by unwanted couplings of the sensing coil to other or outside sources can be accomplished by differential input stage of the electronic evaluation circuit. For low frequency applications the high impedance of input circuit assures high sensitivity and independence of output signal on the sensing coil resistance. For signals with high frequency content the sensing wires of sensing coil act as balanced transmission line with distributed parameters. For flat high frequency response the transmission line have to be matched with impedance equal to its characteristic impedance.

In a further embodiment, flexible current sensor according to invention can be assembled from desired length portion of continuous sensor cable. Such sensor can be advantageously used as means for residual current measurement in large conductor groups for example building wiring and measurement of surge or lightning total and/or partial current in large structures for example buildings, towers or masts.

Due to low sensitivity of the flexible current sensor according to the invention to strange signals and capability to spatial adjustment this flexible current sensor can be advantageously used as current measurement means within measuring devices for example in electricity meters.

Flexible current sensor cable sample according to invention has been manufactured for verification purpose as a continuous cable with sensing coil consisting of 2×4 isolated wires wound and twisted in mutually opposite direction on 7 mm diameter plastic core interconnected in series and with shielding consisting of 2×108 isolated wires wound and twisted in mutually opposite direction interconnected in parallel. Total outer diameter of the outer coat was 12 mm. The sensor was equipped with coupling system consisting of pair of cylindrical caps according to invention. The realized sensor has been used in precision electrical power measurement application as input circuit of working standard for electricity meter testing. The accuracy of the test system inclusive flexible sensor has been determined to be within limits 0.1% in amplitude and 0.1° in phase. It should be understood that the invention is not limited to the parameters noted above.

BRIEF DESCRIPTION OF THE SEVERAL VIEWS OF THE DRAWING

The nature and mode of operation of the present invention will now be more fully described in the following detailed description of the invention taken with the accompanying drawing figures, in which.

DETAILED DESCRIPTION OF THE INVENTION

At the outset, it should be appreciated that like drawing numbers on different drawing views identify identical, or functionally similar, structural elements of the invention. While the present invention is described with respect to what is presently considered to be the preferred aspects, it is to be understood that the invention as claimed is not limited to the disclosed aspects.

Furthermore, it is understood that this invention is not limited to the particular methodology, materials and modifications described and as such may, of course, vary. It is also understood that the terminology used herein is for the purpose of describing particular aspects only, and is not intended to limit the scope of the present invention, which is limited only by the appended claims.

Unless defined otherwise, all technical and scientific terms used herein have the same meaning as commonly understood to one of ordinary skill in the art to which this invention belongs. Although any methods, devices or materials similar or equivalent to those described herein can be used in the practice or testing of the invention, the preferred methods, devices, and materials are now described.

Figure 1:
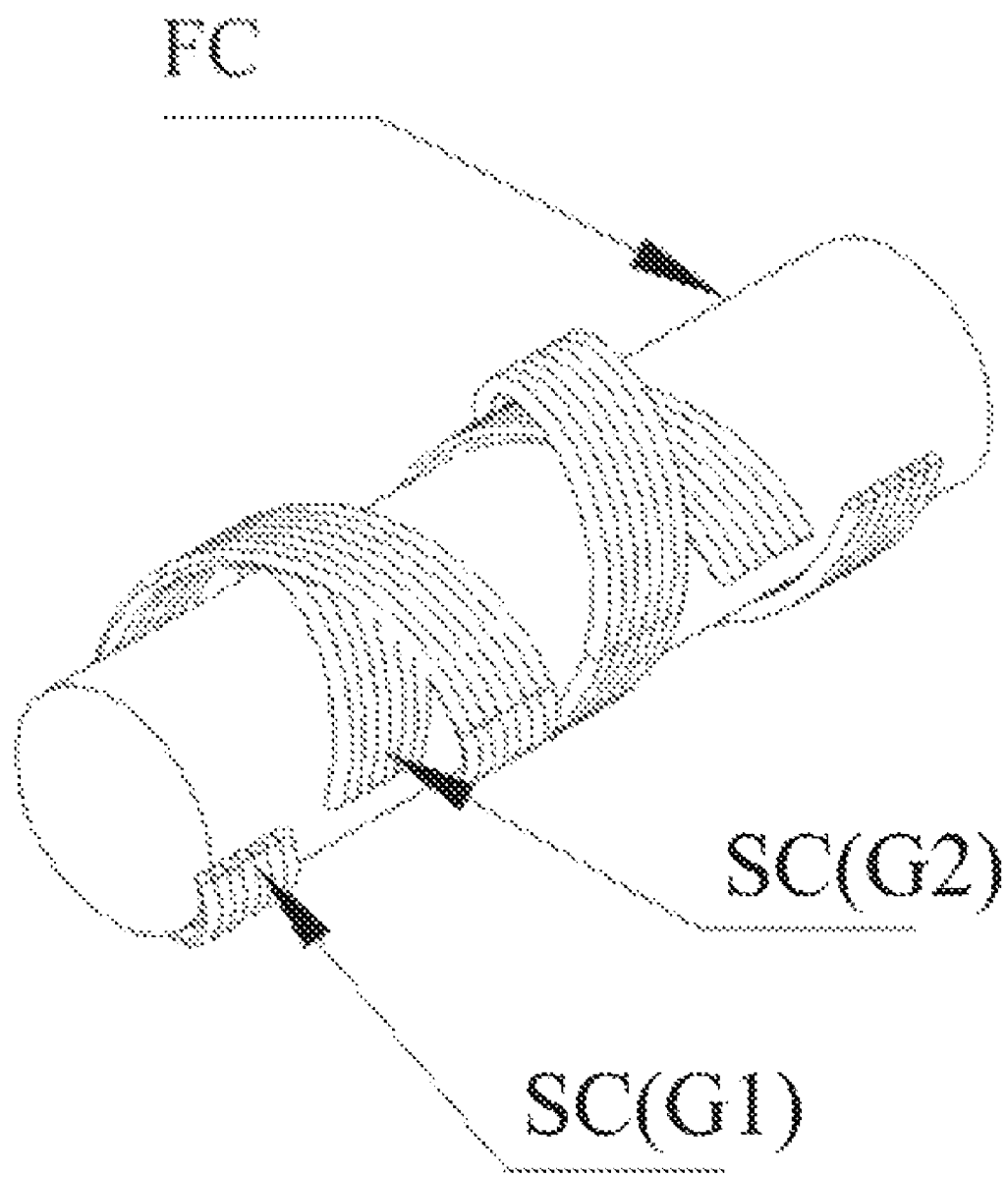
FIG. 1 shows principle of wire arrangement of shielding and/or sensing coil wound on cylindrical flexible core according to the invention.

FIG. 1 shows the principle of wire interconnection of shielding and/or sensing coil wound on cylindrical flexible core FC according to the invention. The coil consists of plurality of individually isolated wires. The wires are divided into two groups G1 and G2. The groups G1 and G2 are wound in mutually opposite directions and the wires of both groups are mutually twisted via periodic interchange of radial position.

Figure 2:
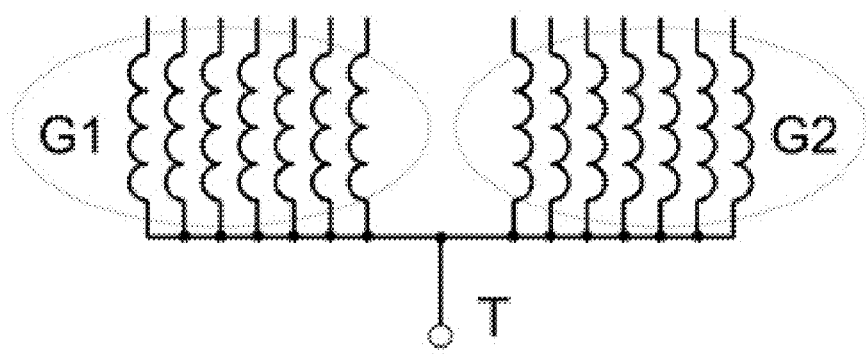
FIG. 2 shows an example of parallel interconnection of shielding wires according to the invention.

FIG. 2 shows an example of parallel interconnection of shielding wires according to the invention. The shielding wires are divided into groups G1 and G2 wound in opposite direction. All shielding wires are electrically interconnected in parallel. Each shielding wire has only one connection point to common terminal T. The parallel configuration of wires of two equal groups wound in opposite direction mutually cancels the magnetic field caused by common capacitive coupling to external voltage source. Therefore the parallel configuration acts as low impedance compact shielding but with advantage of high mechanical flexibility and elimination of measurement error introduced by residual current which would be induced by magnetic field of sensed current in compact shielding.

Figure 3:
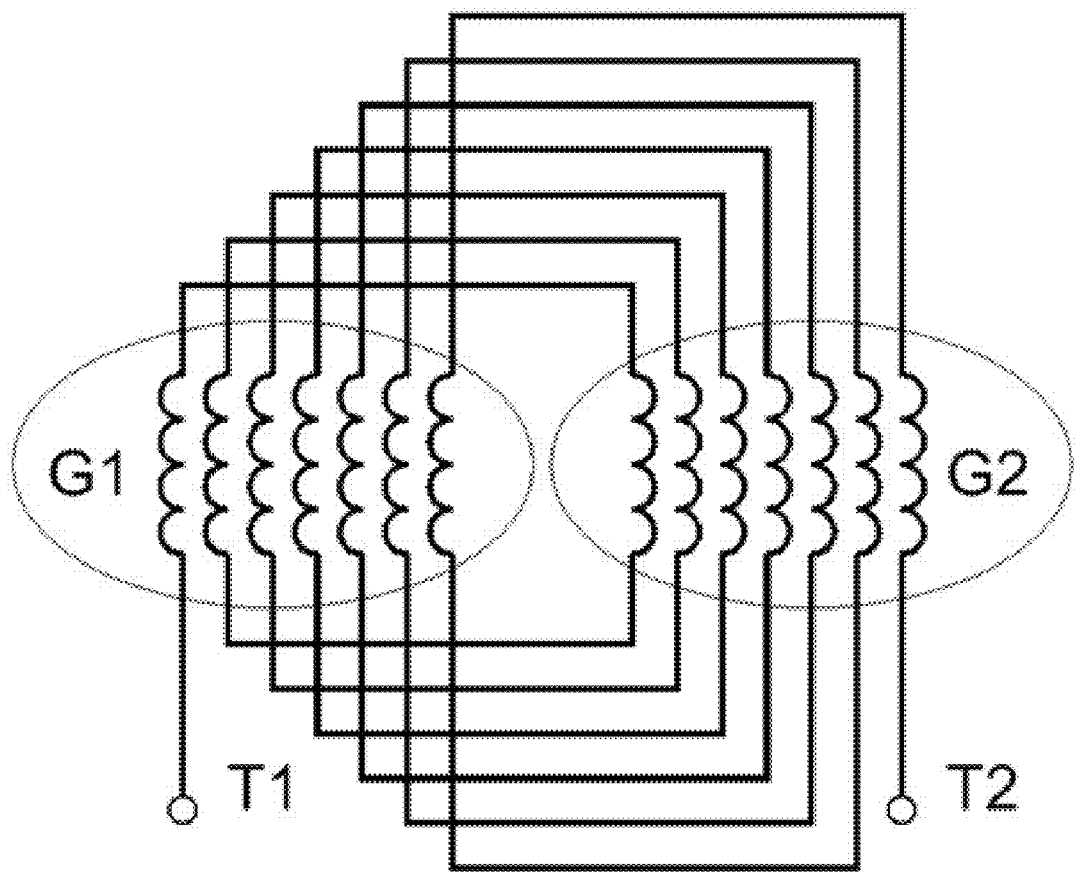
FIG. 3 shows an example of serial interconnection of sensing wires according to the invention.

FIG. 3 shows an example of serial interconnection of sensing wires according to the invention. The sensing wires are divided into two groups G1 and G2. The groups are wound in mutually opposite directions. All sensing wires are electrically interconnected in series. The voltages induced in individual wires by magnetic field of sensed current are in this arrangement added. The sum of voltages appears on terminals T1 and T2. This arrangement is dedicated for applications where the highest sensitivity is required.

Figure 4:
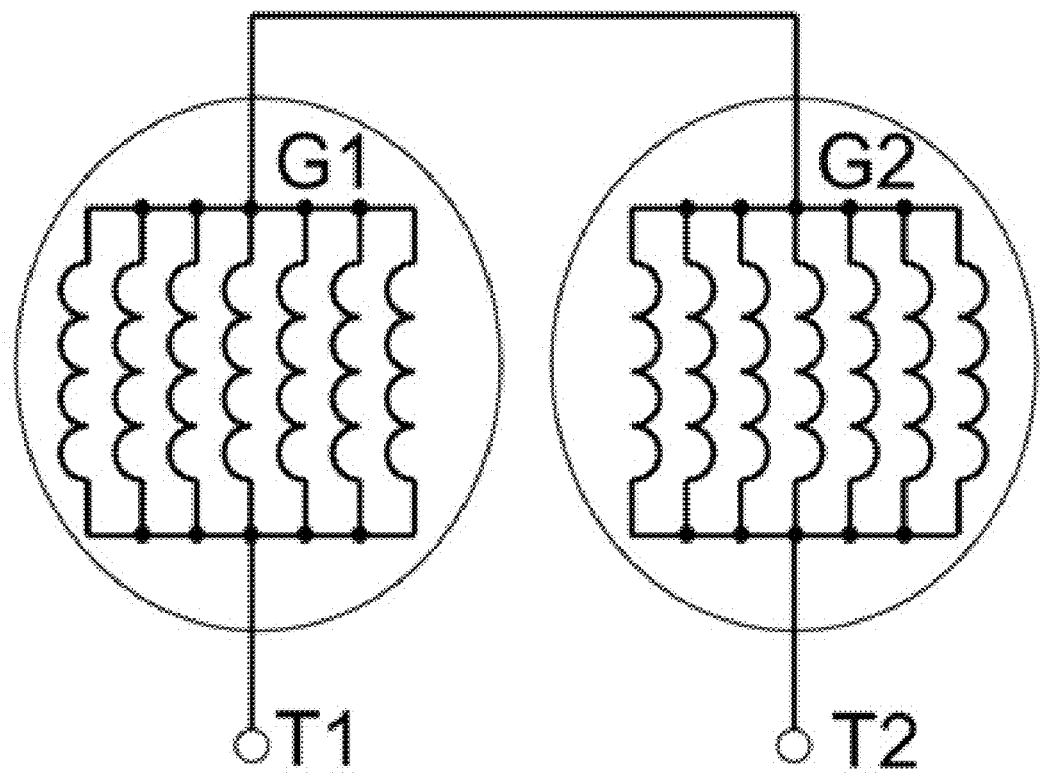
FIG. 4 shows an example of combination of serial and parallel interconnection of sensing wires.

FIG. 4 shows an example of combination of serial and parallel interconnection of sensing wires. The groups G1 and G2 are interconnected in series while the sensing wires of individual groups are electrically interconnected in parallel. This arrangement is dedicated for high current transient measurement applications in which low sensitivity, low coil impedance and broad frequency range is required.

Figure 5:
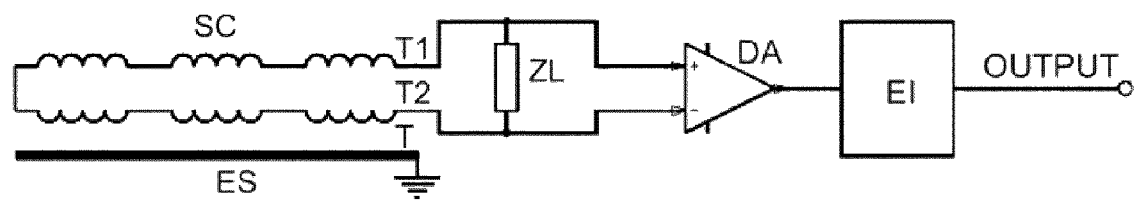
FIG. 5 shows an example of differential input arrangement of an electronic integrator circuit.

FIG. 5 shows an example of differential input arrangement of electronic integrator circuit. The terminals T1 and T2 of sensor coil SC are connected to non-inverting and inverting inputs of differential amplifier DA. The common terminal T of parallel connected shielding wires is connected to electrical ground. The output of differential input stage DA is connected to input of electronic integrator EI. Optional matching by impedance ZL terminating the sensor coil optimizes the high frequency response of the sensor coil.

Figure 6:
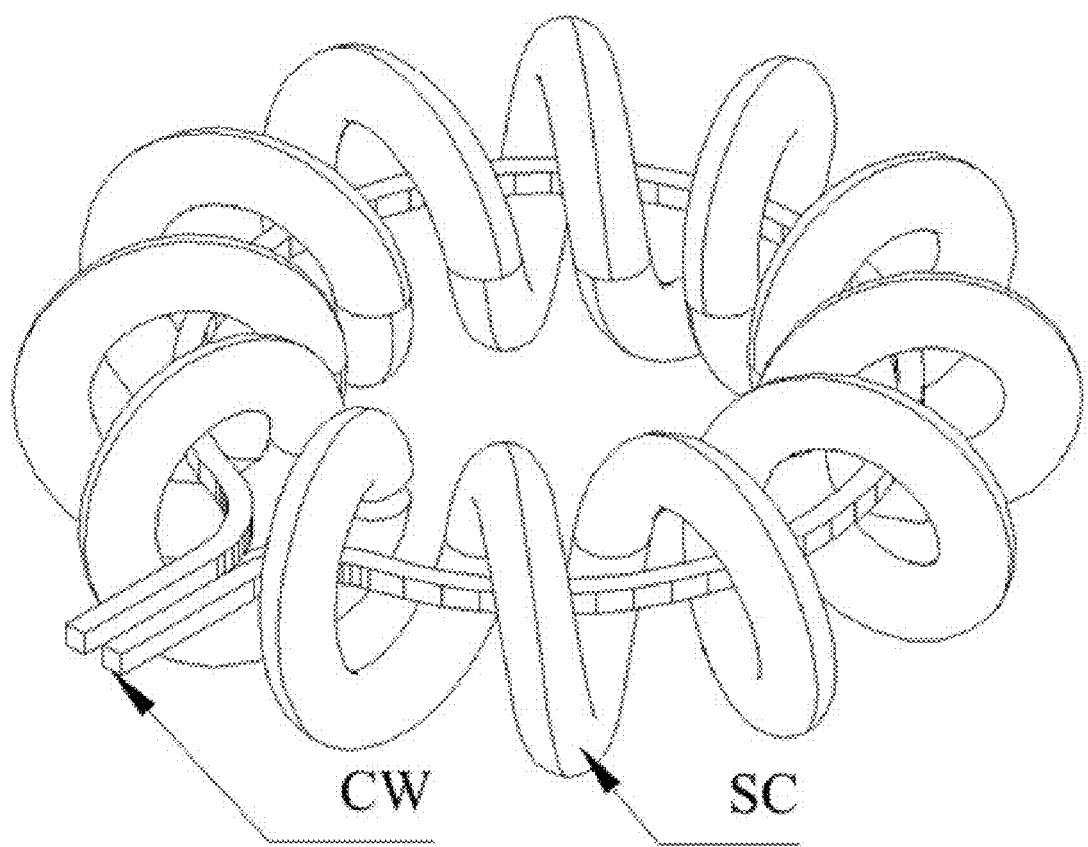
FIG. 6 shows example fragment of flexible current sensor in current measurement application inside an electricity meter.

FIG. 6 shows an example fragment of a flexible current sensor in current measurement application inside an electricity meter. The meter's current wire CW is sensed by multiple turns of sensor cable SC according to the invention. Multiple turn lead to proportional sensitivity increase.

Figure 7:
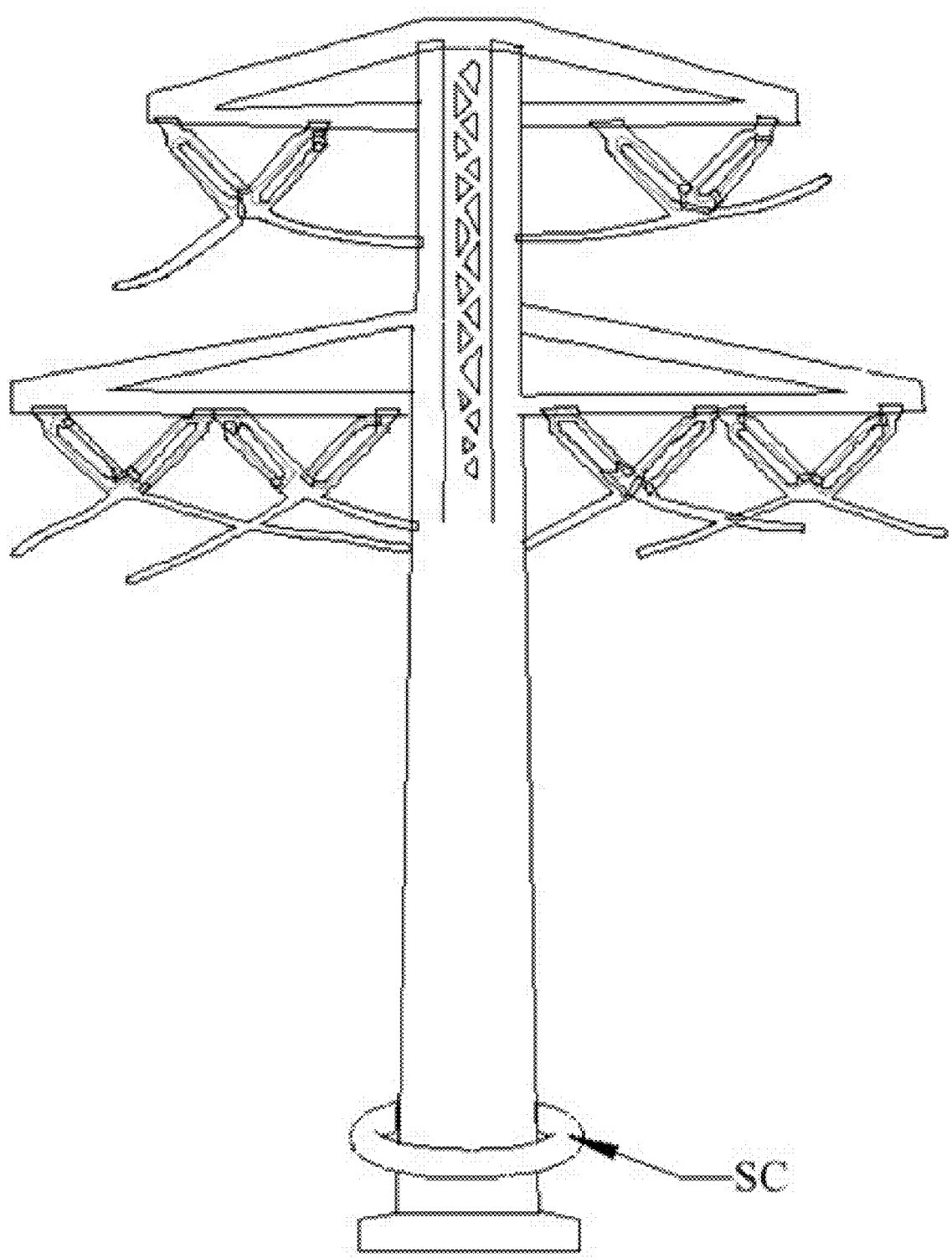
FIG. 7 shows example of flexible current sensor application for discharge current measurement on a high voltage mast.

FIG. 7 shows an example of a flexible current sensor application for discharge current measurement on a high voltage mast. The mast is equipped with flexible current sensor cable SC for measurement of total current flowing through mast stem into the earth.

Figure 8:
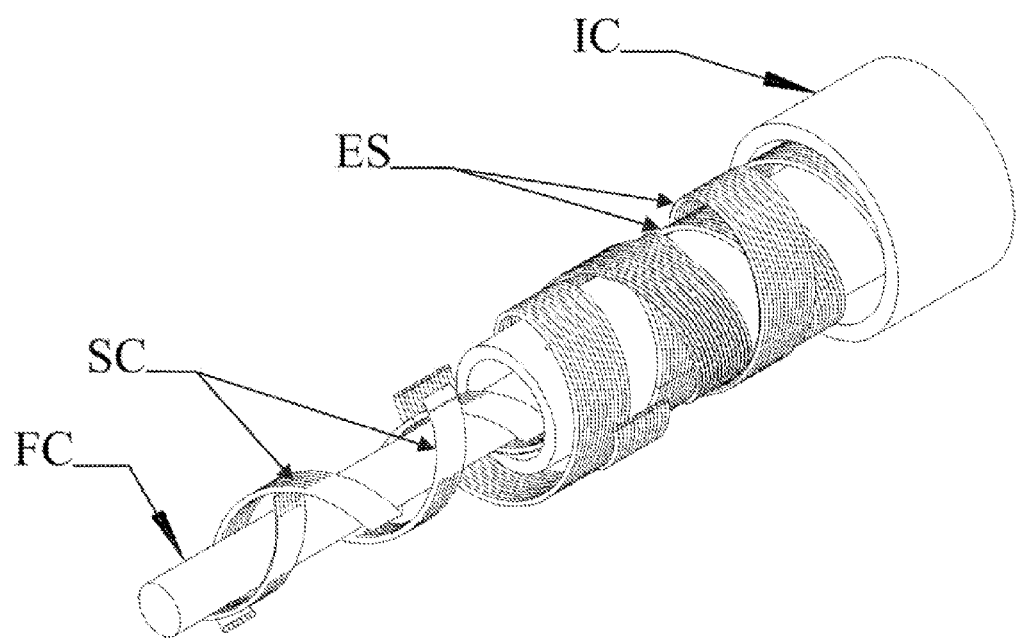
FIG. 8 shows internal structure of a flexible current sensor according to the invention.

FIG. 8 shows internal structure of a flexible current sensor according to the invention. The flexible current sensor consists of cylindrical flexible core FC, sensing coil SC wound on cylindrical flexible core, electrical shielding ES located over said sensing coil and of outer isolation coat IC. Electrical shielding ES consists of a plurality of individually isolated shielding wires arranged into groups wound in mutually opposite direction. Sensing coil SC consists of a plurality of individually isolated sensing wires arranged into groups wound in mutually opposite directions.

Thus, it is seen that the objects of the present invention are efficiently obtained, although modifications and changes to the invention should be readily apparent to those having ordinary skill in the art, which modifications are intended to be within the spirit and scope of the invention as claimed. It also is understood that the foregoing description is illustrative of the present invention and should not be considered as limiting. Therefore, other embodiments of the present invention are possible without departing from the spirit and scope of the present invention.

The invention claimed is:

1. A flexible current sensor including:
 a sensing cable with a sensing coil wound on a single cylindrical flexible core;

electrical shielding located over said sensing coil; and, an outer isolation coat, wherein said electrical shielding includes a plurality of individually isolated shielding wires arranged into groups wound in mutually opposite directions.

2. The flexible current sensor of claim 1, wherein said shielding wires are mutually electrically interconnected in parallel and wherein each shielding wire has only one connection point.

3. The flexible current sensor according of claim 1, including a plurality of individually isolated sensing wires arranged into groups wound in mutually opposite directions, wherein said sensing wires, respective to voltages induced in sensing wires by magnetic field of sensed current, are electrically interconnected in series or in parallel or combination of series and parallel or some sensing wires remain idle respective to voltages induced in sensing wires by magnetic field of sensed current, wherein configuration of said sensing wires is determined by required sensitivity, impedance and frequency range of said current sensor.

4. The flexible current sensor according to claim 3, wherein said sensing wires wound in opposite directions are mutually twisted.

5. The flexible current sensor of claim 3, wherein said sensor cable is a required length portion of continuous cable pre-manufactured on a coaxial cable making machine.

6. An electronic integrator circuit for the flexible current sensor of claim 3 including a differential input stage for said sensing coil.

7. An electronic integrator circuit for the flexible current sensor of claim 3 including a matched termination of said sensing coil with impedance having value approximately equal to wave impedance of the transmission line represented by said sensing coil.

8. A method for use of the flexible current sensor of claim 3 as means for residual current measurement in large conductor groups.

9. A method for use of the flexible current sensor of claim 3 as means for surge or lightning total and/or partial current measurement in large structures.

10. A method for use of the flexible current sensor of claim 3 as current measurement means within measuring devices.

11. The flexible current sensor of claim 1, wherein said shielding wires wound in opposite directions are mutually twisted.

12. A flexible current sensor including:
a single cylindrically shaped flexible core;
a plurality of individually isolated sensing wires arranged into groups wound in mutually opposite directions about the flexible core;
a plurality of individually isolated shielding wires arranged into groups wound in mutually opposite directions about the flexible core; and,
an outer isolation coat.

13. A flexible current sensor comprising:
a sensing cable including a single cylindrical flexible core; and,
a plurality of coaxial sensing coil pairs forming first and second coaxial groups of individually isolated sensing wires, wherein:
each said coaxial sensing coil pair includes respective first and second individually isolated sensing wires;
said first individually isolated sensing wires are wound along said single cylindrical flexible core in a first direction; and,
said second individually isolated sensing wires are wound along said single cylindrical flexible core in a second direction, opposite the first direction.

* * * * *